United States Patent [19]
Baker et al.

[11] 3,983,023
[45] Sept. 28, 1976

[54] INTEGRATED SEMICONDUCTOR CIRCUIT MASTER-SLICE STRUCTURE IN WHICH THE INSULATION LAYER BENEATH UNUSED CONTACT TERMINALS IS FREE OF SHORT-CIRCUITS

[75] Inventors: Theodore H. Baker; Majid Ghafghaichi, both of Poughkeepsie; Daniel Tuman, Beacon, all of N.Y.

[73] Assignee: IBM Corporation, Armonk, N.Y.

[22] Filed: Mar. 30, 1971

[21] Appl. No.: 129,430

[52] U.S. Cl. ............................ 204/192; 317/101 A
[51] Int. Cl.² ........................................ C23C 15/00
[58] Field of Search ........ 317/101 A, 235 E, 235 T, 317/2 R; 204/192

[56] References Cited
UNITED STATES PATENTS

| | | | |
|---|---|---|---|
| 3,388,301 | 6/1968 | James | 317/101 A |
| 3,469,155 | 9/1969 | Van Beek | 317/235 E |
| 3,539,876 | 11/1970 | Feinberg et al. | 317/101 A |
| 3,658,678 | 4/1972 | Gregor et al. | 317/235 B |

*Primary Examiner*—David Smith, Jr.
*Attorney, Agent, or Firm*—J. B. Kraft

[57] ABSTRACT

A planar integrated semiconductor circuit master-slice structure in which the insulation layer over the planar surface remains intact and free of undesirable short-circuit paths in the area beneath excess "unused" contact terminals which are not part of the selected circuit configuration formed by a selected surface metallization pattern on the insulative layer which selectively interconnects less than all of the contact terminals with less than all of the components extending from the planar surface of a semiconductor substrate beneath the insulative layer.

During D.C. sputter cleaning or etching utilized in the formation of the contact terminals and the metallization pattern, there is an undesirable charge accumulation on the unused contact terminals which tends to exceed the dielectric breakdown strength of the insulative layer beneath the terminal. This shorts the unused pad to the semiconductor substrate beneath the terminal. Such short-circuits are avoided by an additional metallization line, not part of the circuit configuration, which connects the unused contact terminal to an unused electrically isolated component e.g. junction isolated component in the semiconductor substrate.

4 Claims, 3 Drawing Figures

INTEGRATED SEMICONDUCTOR CIRCUIT MASTER-SLICE STRUCTURE IN WHICH THE INSULATION LAYER BENEATH UNUSED CONTACT TERMINALS IS FREE OF SHORT-CIRCUITS

BACKGROUND OF THE INVENTION

The present invention relates to monolithic semiconductor planar integrated circuit masterslice structures, and is particularly directed to a structural expedient which avoids the dielectric breakdown of the insulative layer over the semiconductor substrate during D.C. sputtering.

Planar integrated semiconductor circuit masterslices, in general, comprise an excess of active and passive components formed at the planar surface of a semiconductor member which may conventionally be a semiconductor substrate supporting an epitaxial layer containing the planar surface. The planar surface is covered by a layer of insulative material such as silicon dioxide. On the surface of the insulative layer, an excess number of contact terminals or paths are disposed in spaced relationship to each other, and there is a metallization pattern for selectively interconnecting a plurality but less than all of the excess number of contact terminals with a plurality but less than all of the excess number of components to provide a selected or tailored integrated circuit configuration. The metallization pattern is connected to the selected components in the semiconductor substrate by means of electrical contacts passing through openings in the insulative layer. Integrated circuits of this type and appropriate methods for the fabrication thereof are described in U.S. Pat. No. 3,539,876.

The contact terminals in the masterslice may conveniently have a structure such as that of the pad shown in FIG. 1P and described in Columns 17 and 18 of U.S. Pat. No. 3,539,876. In the formation of such electrical contact as well as metallization pattern of the masterslice, D.C. sputter etching or cleaning may be desirably used instead of or as a supplement to the chemical etching or cleaning steps described in Columns 17 and 18 of the above mentioned patent. For example, subsequent to the formation of the chemically etched contact terminal openings to the aluminum metallization as shown in step 4, FIG. 1P of said patent, it is desirable to utilize an additional D.C. sputter cleaning step to remove any residues or contaminants from the openings. A known and acceptable procedure for accomplishing such sputter cleaning is described in U.S. Pat. No. 3,410,774.

We have found that while D.C. sputter cleaning, such as described in U.S. Pat. No. 3,410,774, has been satisfactory when used to clean contact terminals or terminal sites which are included in the configuration and, therefore, interconnected with components by the aluminum metallization pattern, problems have arisen when the D.C. sputtering is used for excess contact terminals which are not part of the circuit configuration. In such unconnected terminals, very high electrical charge accumulations were noted which tended to exceed the dielectric breakdown strength of the material in the insulative layer. As a result, there was an often very extensive short-circuit from the unused or excess pad to the underlying substrate through the deteriorated underlying insulative layer. We found the tendency towards such shorts in only the unused or excess contact terminals despite the use of the cathodically biased mask in the procedure and structure described in U.S. Pat. No. 3,410,774.

At this point, it should be noted that even the use of an isolation pocket such as 18P in the structure described in FIG. 1P of U.S. Pat. No. 3,539,876 under the unused contact terminal will not necessarily insure against the detrimental effects of a dielectric breakdown of the insulative layer in this area.

While such an isolation pocket is capable of isolating shorts caused by pin-holes in the insulative layer as described in Column 18 of U.S. Pat. No. 3,539,876, the effects of dielectric breakdown are more massive and consequently, the short-circuits are more extensive. Such dielectric breakdown may often extend beyond the junction boundaries of the isolation pocket. This may particularly be the case when, as will be hereinafter shown, the metallization of the contact terminal extends beyond the junction boundaries of the isolation pocket. One possible solution negating the effect of dielectric breakdown would be to use larger isolation pockets so that the junctions surrounding the isolation pockets will extend beyond the limits of possible dielectric breakdown in the unused pad area or at least beyond the limits of the metallization of the contact terminal. However, such enlarged terminal isolation pockets would use up valuable "real estate" of the planar semiconductor surface which, of course, would be highly undesirable with the ever-increasing trend towards component densification in large scale integration. This would be especially true since the structure is a masterslice, and consequently, not only would the isolation pocket associated with the unused problem contact terminal have to be enlarged but the isolation pockets associated with all of the contact terminals would have to be enlarged. The reason for this being that in different circuits which may be fabricated from the masterslice, different contact terminals may end up being unused.

Accordingly, when the dielectric breakdown of the insulative layer under the contact terminal extends beyond the isolation pocket, one possible effect would be short-circuiting of other junctions in the semiconductor substrate.

In any event, one very significant undesirable effect of such dielectric breakdown in the area below the unused contact terminal has been in module package structures in which the integrated circuit chip is mounted on a dielectric substrate. Such a module package is shown in FIGS. 18 and 19 of U.S. Pat. No. 3,539,876. In this module package, the integrated circuit chip is mounted on the dielectric substrate so that all of the contact terminals which are part of the selected masterslice circuit configuration are each mounted on a conductive land on the dielectric substrate. These lands provide a conductive path to the pins in the modules. Because of the close spacing of the module lands which extend or radiate from the chip to the pins, it is often very difficult, if not impossible, for a module land to extend from a circuit contact terminal along one side of the mounted chip to a module pin beyond the opposite side of the module chip and still avoid contact with the other module lands without passing or crossing the land under the mounted chip, i.e., between the chip and the dielectric substrate. However, even when the module land is so passed under the chip, it is substantially not possible for the module land extending from the circuit contact terminal to the pin to take a path which avoids contact with at least one additional contact terminal because of the close spacing of the contact terminals in the chip. Thus, it is desirable to select such a path wherein the additional contact terminal which the land passing under the chip must touch is one of the excess contact terminal "unused" in the selected masterslice circuit configuration. When such a path is included in a module package, the previously mentioned problem of dielectric breakdown of the insulative layer under the unused contact terminal becomes very significant since a breakdown will short-circuit the entire circuit configuration to the substrate through the unused contact terminal.

SUMMARY OF THE INVENTION

Accordingly, the primary object of the present invention is to provide an integrated semiconductor circuit masterslice structure which is free of dielectric breakdown in the insulative layer beneath an unused excess contact terminal.

Another object of the invention is to provide an integrated semiconductor circuit masterslice structure in which there are no undesirable short-circuits between "unused" excess contact terminals and the underlying semiconductor substrate.

It is a further object of the present invention to provide a module package for a semiconductor masterslice chip on a dielectric substrate which permits a conductive path, free of short-circuits, between a contact terminal along one side of the chip and a module pin beyond the opposite side of the chip.

It is an even further object of the present invention to provide a module package with a conductive land path extending between the dielectric module substrate and the chip to join the contact terminal which is part of the masterslice circuit configuration on the chip to a module pin which path contacts but is not short-circuited by an unused contact terminal of the chip.

It is yet a further object of the present invention to provide a method of D.C. sputter etching or cleaning during the formation of contact terminals in a masterslice integrated circuit structure in which unused conductive terminals which are not part of the selective circuit configuration remain free of undesirable short-circuits to the semiconductor substrate as a result of dielectric breakdown of the insulative layer beneath the contact terminal.

The present invention provides an integrated semiconductor masterslice structure which is not subject to dielectric breakdown of the insulative layer beneath unused contact terminals. The masterslice structure comprises, in combination, a monocrystalline semiconductor member or substrate with an excess number of spaced conductive contact terminals on a planar surface of the substrate, the terminals being supported on an insulative layer disposed between the terminals and substrate, and an excess number of electrically isolated active and passive components extending from said planar surface into the substrate, thereby permitting a variety of different integrated circuits to be fabricated from the masterslice structure by selectively interconnecting the desired active and passive components with selected terminals. A conductive connector pattern over the planar surface, e.g. on the insulative layer selectively interconnects a plurality of the components and a plurality of terminals into a selected integrated circuit configuration. The structure further contains an additional conductive connector which is not part of the connector pattern; this additional connector connect one of the excess or unused terminals which is not part of the selected circuit configurations, to one of the excess or unused components which is not part of the circuit configuration. This additional connection provides a conductive path from the terminal to the semiconductor substrate which acts to drain the charge built up on the conductive terminal during D.C. sputtering thereby preventing an accumulation on the metallization of the excess terminal sufficient to excess the dielectric breakdown strength of the insulative layer beneath this excess terminal. Thus, the insulative layer in this area will remain intact during D.C. sputter cleaning or etching processes and the excess terminal will remain free of any undesirable short-circuits through the insulative layer to the substrate. Since the unused component to which the terminal is connected is not part of the selected masterslice integrated circuit configuration, this additional connection will in no way affect the selected circuit configuration. The excess component to which the excess terminal is connected is electrically isolated from other components in the integrated circuit by means of junction isolation in the masterslice.

The conductive connector pattern is preferably a metallization pattern on the insulative layer of a selected configuration which selectively contacts less than all of the components in the masterslice by electrical contacts extending through the insulative layer; the metallization pattern also selectively connects less than all of said excess terminals with the components to provide the circuit.

The present invention further provides a module package comprising the above described masterslice in combination with a dielectric substrate on which the masterslice is mounted in such a fashion that each of the terminals or pads in the circuit configuration is connected to a pin by a conductive module land. At least one of the terminals in the circuit configuration being connected to a pin by a module land which passes between the dielectric substrate and the masterslice chip and further contacts one of the excess or unused terminals. By means of the previously described additional connector on the chip which connects this unused terminal to one of the electrically isolated components in the masterslice chip which is not part of the circuit configuration, the unused terminal is prevented from being short-circuited to the substrate of the chip and, thereby, short-circuiting the module land to the chip substrate.

The present invention further involves an improvement in the method of reverse cathodic sputtering to remove materials from planar surfaces of planar integrated circuit masterslice wherein the portion of the insulative layer beneath one or more of the excess or unused terminals is protected against dielectric breakdown from high charge accumulations by connecting this unused terminal to an unused excess component in the masterslice chip.

The foregoing and other objects, features and advantages of the invention will be apparent from the following more particular description and preferred embodiments of the invention as illustrated in the accompanying drawings.

DESCRIPTION OF THE PREFERRED EMBODIMENT

Figure 1:
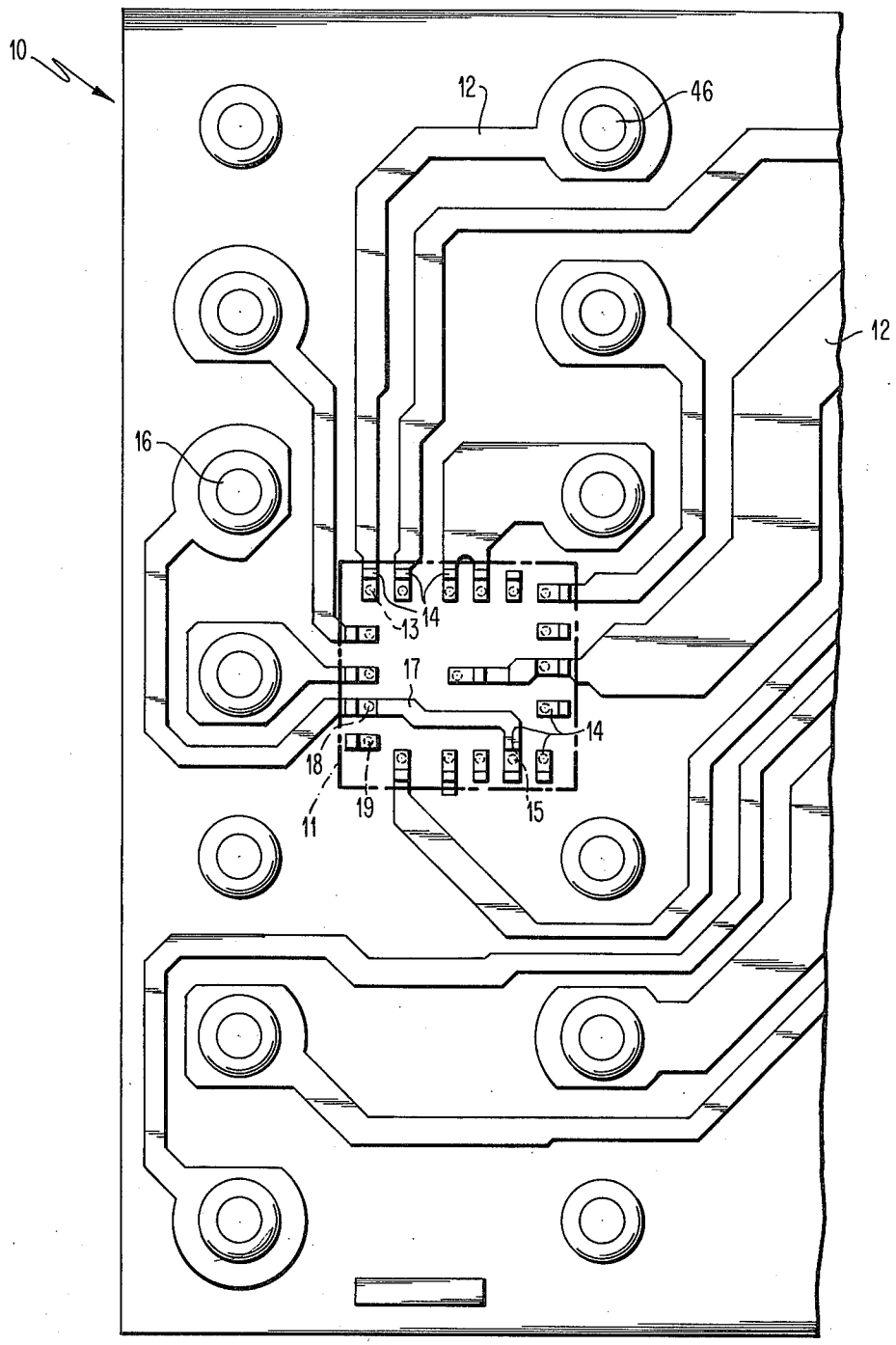
FIG. 1 is the top view of a portion of a dielectric substrate in a module package in accordance with the preferred embodiment of the present invention wherei the semiconductor integrated circuit masterslice chip supported on and connected to the lands on the substrate is shown in phantom lines.

FIG. 1 is the top view of a module package in accordance with the present invention. In general, the construction of the module package is of the type described in Column 25 of U.S. Pat. No. 3,539,876 with respect to FIGS. 18 and 19 of said patent. The package consists of a ceramic module 10 on which the integrated circuit semiconductor chip 11 is mounted. The chip is shown in phantom lines so as to reveal the conductive land pattern on the module surface beneath the chip. The actual structure which consists of a pair of chips mounted on the ceramic substrate as in U.S. Pat. No. 3,539,876 has been broken for convenience so as to show only one of the mounted chips. A printed conductive land pattern 12 on the surface of ceramic substrate 10 acts to provide conductive paths between the chip terminals or pads 13 and pin 46. The printed circuit pattern may be conveniently constructed in accordance with U.S. Pat. No. 3,429,040. The chip pads 13 are each supported on fingers 14 of lands 12. In the structure shown, it is necessary to connect chip pad 15 which is part of the selected masterslice circuit configuration on the chip with module pin 16. Because of the high density of the land pattern 12 on the ceramic substrate, there is substantially no conductive land path possible on the ceramic substrate connecting the finger on which chip pad 15 is mounted and module pin 16 which avoids other conductive lands without passing under the chip. Consequently, a module land path 17 must pass under the chip. Even in this case, however, the chip pads are spaced so close together that it is not possible for land path 17 to emerge from under the chip without contacting another chip pad. Land 17 must pass under and contact chip pad 18. Pad 18 is an unused pad, i.e. one of the excess pads which is not part of the selected masterslice integrated circuit configuration. Such an unused chip pad is selected because it is not part of the integrated circuit configuration and, consequently, would be expected not to short-circuit pad 15 to a device in the circuit.

However, as previously mentioned, an unused pad or chip terminal such as 18 which is not part of the circuit configuration is subject to insulation breakdown problems during D.C. sputter etching or cleaning processes utilized in the fabrication of the connector metallization and of the pads. The chip structure, in accordance with the present invention, avoids this insulation breakdown problem.

Figure 2:
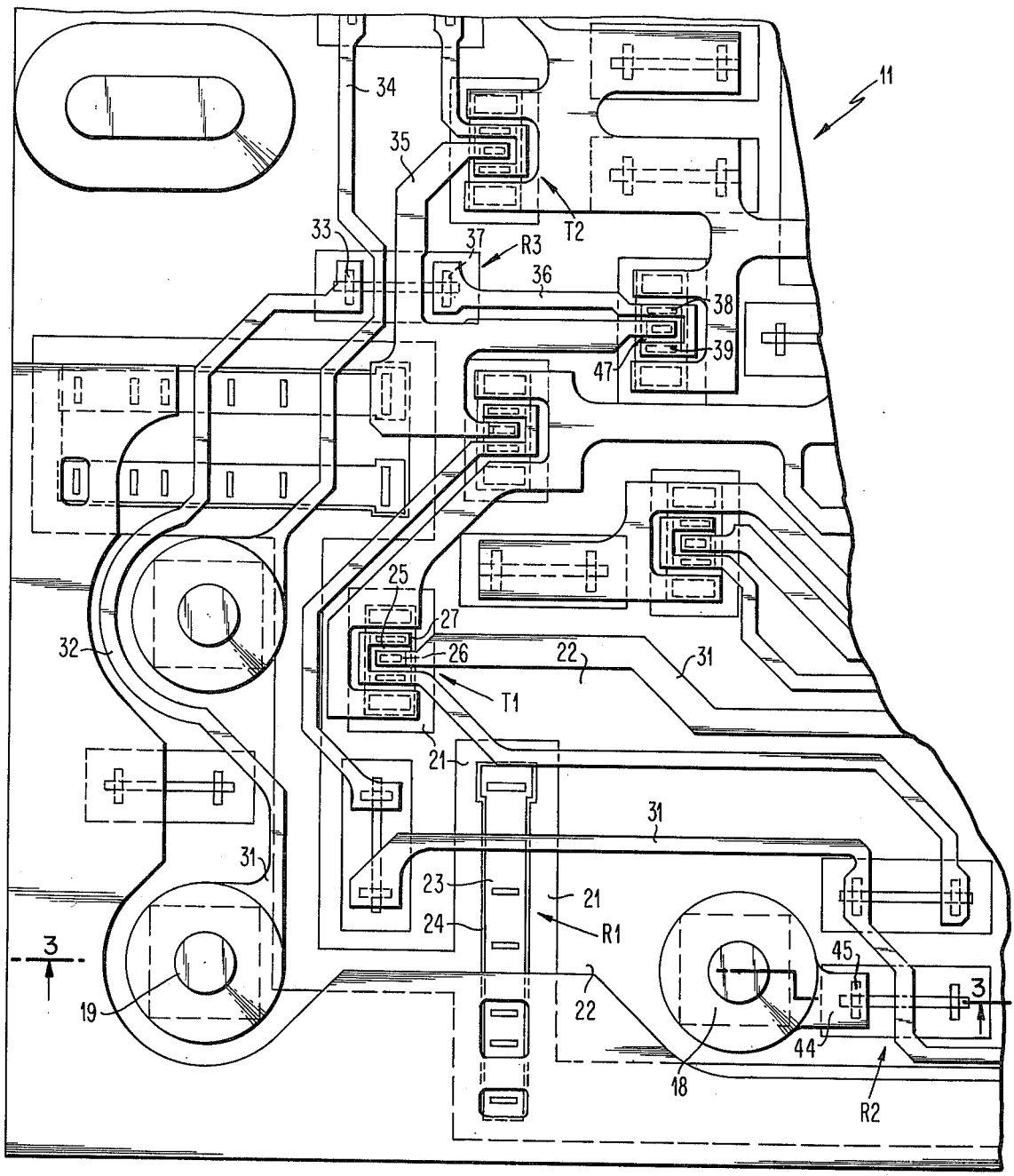
FIG. 2 is a detailed fragmentary plan view of a portion of a masterslice integrated semiconductor chip structure in accordance with the present invention.
Figure 3:
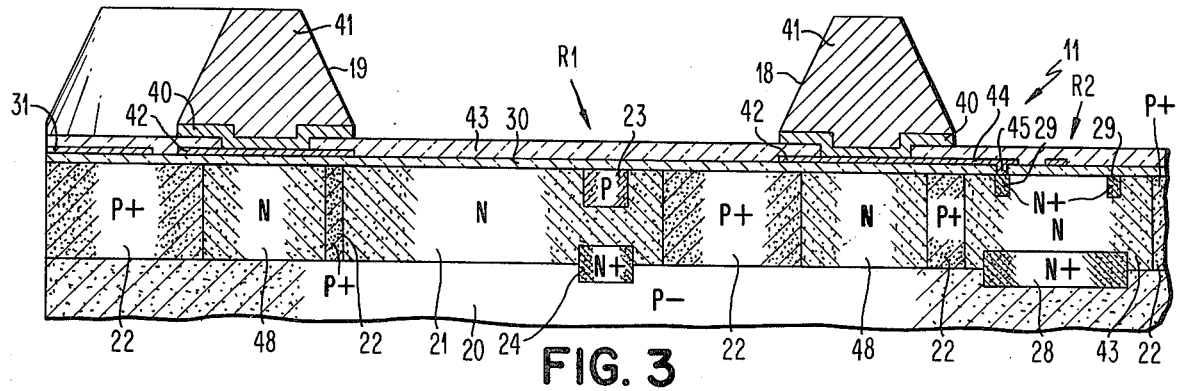
FIG. 3 is a cross sectional view taken along line 3—3 in FIG. 2.

With reference to FIGS. 2 and 3, the D.C. sputter etching problem will be explained and its solution will be described. FIGS. 2 and 3 show a portion of the masterslice chip 11. For purposes of orientation of the section of the chip shown in FIG. 2 with respect to the chip shown in phantom in FIG. 1, it should be noted that FIG. 2 represents the underside of the chip 11 shown in phantom shown in FIG. 1 and its orientation has been rotated 90°. Pad 18 may be best oriented with respect to its adjacent pad 19 in these two figures. The masterslice chip shown in FIGS. 2 and 3 is fabricated in the general manner described in U.S. Pat. No. 3,539,876. The chip pads and metallization are fabricated, in general, by the process described in Columns 17 and 18 of U.S. Pat. No. 3,539,876 and have the structure shown in FIG. 1P, step 5 of this patent.

With respect to FIG. 3, pads 18 and 19 are formed on the semiconductor substrate which consists of a base 20 of a P− conductivity type supporting an epitaxial layer 21 of N type conductivity. P+ isolation regions 22, in combination with P− substrate 20, isolate a plurality of N regions within the epitaxial layer. It is within these regions in the epitaxial layer that the active and passive components of the integrated circuit masterslice are formed. Resistor R1 is such a typical component; it comprises an elongated P region 23 formed within the isolated N pocket 21 of the epitaxial layer. N+ buried region 24 extends for the length of P region 23 underneath said resistor. Resistor R1 has essentially the structure shown in Step 5, FIG. 1R of U.S. Pat. No. 3,539,876.

Transistor T1, which is not shown in cross section but only in top view in FIG. 2, is a typical transistor. It comprises an N region 21 surrounded by a P+ isolation region 22. The N region forms the collector of the transistor. Base region 25 is enclosed within collector region 21, and emitter region 26 is enclosed within base region 25. An N+ buried region 27 extends under the central portion of the transistor to provide a transistor structure essentially like that shown in step 7 of FIG. 1T of U.S. Pat. No. 3,539,876. Resistor R2 has a structure similar to that of the resistor shown in FIG. 2R, Step 7 of U.S. Pat. No. 3,539,876. It comprises a buried region N+ 28 and a pair of N+ contact diffusions 29 so that if resistor R2 functions as a component in the integrated circuit, the path would be into one of the contacts 29 down through the buried region 28 and then to the other contact 29. As will be hereinafter described in greater detail, in the structure shown, resistor R2 is an excess or unused component which is not part of the selected integrated circuit configuration connected together by the metallization pattern.

The planar surface of the epitaxial layer is covered with a layer of insulative material 30 which may conveniently be silicon dioxide. Metallization pattern 31 of a preselected configuration is formed in accordance with the procedure in U.s. Pat. No. 3,539,876 to selectively interconnect less than all of the active and passive components in the masterslice and less than all of the terminals. Metallization pattern 31 is insulated from the underlying semiconductor substrate by insulative layer 30, and when it is desired to selectively connect this metallization pattern to a selected component, the metallization is connected through a contact opening which passes through the insulative layer. For example, metallization line 32 in the metallization pattern selectively connects contact terminal or pad 19 to resistor R3 through contact 33. This resistor passes under metallization segments 34 and 35 and is in turn connected to metallization segment 36 through contact 37. Metallization segment 36 is in turn connected to base 47 of transistor T2 through contacts 38 and 39. Thus, resistor R3 and transistor T2 are components which are selected and made part of the selected masterslice circuit configuration by means of this metallization pattern. On the other hand, the previously described resistor R1 represents a component which is not part of the selected circuit configuration since no segment of the metallization 31 makes contact with this resistor through an appropriate contact opening.

The contact terminal or pad has substantially the same construction as that described in U.S. Pat. No. 3,539,876. The lower portion of each pad, i.e. that which is seated on the insulative layer 30 is part of the surface metallization which may be conveniently referred to as underlying metallization segment 42. Layer 40 in each pad is the chromium, copper, and gold composite described in U.S. Pat. No. 3,539,876 and the pad proper 41 is formed of solder. When the pad is part of the selected masterslice circuit configuration, then underlying metallization segment 42 is continuous with the circuit metallization 31. An isolated N region 48 underlies each of the pads to provide isolation in the event of any pin holes in insulative layer 30 beneath the pad.

Now, to provide an illustration of the D.C. sputter etching or cleaning problem which the present invention solves, it has been found to be desirable to use D.C. sputter etching or cleaning as a substitute or supplement for one or more of the chemical etching or cleaning steps used in metallization and/or pad formation procedures described in Columns 17 and 18 of U.S. Pat. No. 3,539,876. For example, subsequent to the chemical etching or openings in the second insulative layer which covers the metallization pattern to provide contact openings for the pads in Step 4, FIG. 1P of said patent, it is desirable to utilize an additional D.C. sputter cleaning step to remove any undesirable residues or contaminants from these openings. The D.C. sputter cleaning procedure and equipment utilized may be that described in U.S. Pat. No. 3,410,774. This second insulative layer is equivalent to insulative layer 43 in the structure of the present invention shown in FIG. 3. The contact openings thus formed are to be filled by the subsequent deposition of the chromium, copper, and gold composite layer of the pad. We have found that in carrying out D.C. sputter cleaning or etching in the pad regions, no problem is presented where the pad is selectively interconnected into the masterslice figuration. In such case, the metallization segment 42 beneath the pad is already connected into the metallization pattern of the circuit configuration. On the other hand, in the excess or unused terminals in which the metallization segment 42 is not part of the circuit metallization pattern, high charge accumulations result during D.C. sputtering which often exceeded the dielectric strength of insulative layer 30 causing extensive dielectric breakdown of the insulative layer beneath metallization segments 42 in such unused pads.

The problem of charge accumulations causing dielectric breakdown of insulative layer 30 beneath the unused pad such as pad 18 is solved by connecting this pad or rather the underlying metallization segment 42 of this pad to an unused component R2 which is also not part of the selected circuit configuration. Metallization segment 42 of unused pad 18 is connected by metallization line 44, not part of the selected circuit metallization pattern, to resistor R2 through metal contact 45. Resistor 42 is not part of selected circuit configuration, i.e. there is no contact to resistor R2 other than contact 45, and resistor R2 remains enclosed by N isolation pocket within an enclosure formed by the combination of P+ isolation region and the P− substrate. By this expedient of connecting the metallization of unused contact terminal 18 to an unused component R2, charge accumulation on underlying metallization 42 sufficient to cause the dielectric breakdown of insulative layer 30 beneath pad 18 is eliminated. This eliminates short-circuits through the insulative layer beneath metallization segment 42 and the underlying semiconductor member, particularly, the P+ isolation region by providing a path to bleed off the accumulated charge to the substrate.

While the invention has been particularly shown and described with reference to a preferred embodiment thereof, it will be understood by those skilled in the art that various changes in form and detail may be made therein without departing from the spirit and scope of the invention.

What is claimed is:

1. In the method of reverse cathodic sputtering to remove materials from the planar surface of a planar integrated circuit masterslice structure including the active and passive components formed from a plurality of regions of different conductivity types extending from said planar surface into said substrate, the improvement comprising:

protecting the portion of said insulative layer beneath at least one of said excess terminals not selectively connected into said circuit configuration against dielectric breakdown resulting from high electrostatic charge accumulations by connecting said one excess terminal to one of said excess electrically isolated components not selectively connected into said circuit configuration.

2. The method of claim 1 wherein said terminals are conductive pads.

3. The method of claim 1 wherein the active and passive components in the chip are formed by a plurality of regions of different conductivity types extending from the planar surface.

4. The method of claim 3 wherein said one excess component to which said one excess contact terminal is connected is an electrically isolated one of said plurality of regions.

* * * * *